(12) United States Patent
Chang

(10) Patent No.: US 7,634,677 B2
(45) Date of Patent: Dec. 15, 2009

(54) CIRCUIT AND METHOD FOR OUTPUTTING ALIGNED STROBE SIGNAL AND PARALLEL DATA SIGNAL

(75) Inventor: Chi Chang, Taipei (TW)

(73) Assignee: Via Technologies, Inc., Taipei (TW)

( * ) Notice: Subject to any disclaimer, the term of this patent is extended or adjusted under 35 U.S.C. 154(b) by 452 days.

(21) Appl. No.: 11/559,732

(22) Filed: Nov. 14, 2006

(65) Prior Publication Data
US 2007/0070733 A1 Mar. 29, 2007

Related U.S. Application Data

(62) Division of application No. 10/455,717, filed on Jun. 5, 2003, now Pat. No. 7,278,046.

(30) Foreign Application Priority Data
Jun. 26, 2002 (TW) .............................. 91113973 A

(51) Int. Cl.
*G06F 1/00* (2006.01)
(52) U.S. Cl. .................. 713/500; 327/149; 327/161
(58) Field of Classification Search .............. 713/500; 327/149, 161
See application file for complete search history.

(56) References Cited
U.S. PATENT DOCUMENTS 5,313,501 A * 5/1994 Thacker ................. 375/369
6,005,412 A * 12/1999 Ranjan et al. ............. 326/63
6,157,229 A * 12/2000 Yoshikawa ................ 327/149
6,526,106 B1 * 2/2003 Migita .................. 375/354
6,998,892 B1 * 2/2006 Nguyen et al. ............. 327/161
2004/0130347 A1 * 7/2004 Moll et al. ................. 326/62

OTHER PUBLICATIONS

U.S. Appl. No. 10/455,717, titled "Circuit and Method for Outputting Aligned Strobe Signal and Parallel Data Signal," filed Jun. 5, 2003, with inventor Chi Chang.

* cited by examiner

*Primary Examiner*—Thomas Lee
*Assistant Examiner*—Vincent T Tran
(74) *Attorney, Agent, or Firm*—Kirton & McConkie; Evan R. Witt

(57) ABSTRACT

An output circuit includes a detector receiving a parallel data signal, detecting a level change degree for the parallel data signal between a first time point and a second time point, and outputting a select signal according to the level change degree; a delay adjusting device receiving and differentially delaying the parallel data signal into a first and a second delayed parallel data signals with a first and a second delay time, respectively; and a first multiplexer electrically connected to the detector and the delay adjusting device, and selecting one of the first and the second delayed parallel data signals to be outputted in response to the select signal.

11 Claims, 10 Drawing Sheets

US 7,634,677 B2

CIRCUIT AND METHOD FOR OUTPUTTING ALIGNED STROBE SIGNAL AND PARALLEL DATA SIGNAL

CROSS REFERENCE TO RELATED PATENT APPLICATION

This patent application is a divisional application of a U.S. patent application Ser. No. 10/455,717 filed Jun. 5, 2003 and now pending. The contents of the related patent application are incorporated herein for reference.

FIELD OF THE INVENTION

The present invention relates to a circuit for outputting a strobe signal and a parallel data signal, and more particularly to a circuit for outputting aligned strobe and parallel data signals. The present invention also relates to a method for aligning and outputting a parallel data signal and a strobe signal.

BACKGROUND OF THE INVENTION

For complying with the increasing processing frequency of a core of a computer system chip, data transmitted via I/O buses are preferably parallel data. However, problems are likely to occur during the transmission of parallel data signals. For example, power/ground bounce noise is likely generated at the input and output ends. Generally, when the output end of an output buffer is in switching status, a power/ground bounce noise is derived from the flow of intense current through the parasitic inductance of the bonding wires, lead frame or pin. In addition, it may suffer from a so-called SSO (simultaneous switching output) skew phenomenon.

Please refer to FIG. 1, which schematically illustrates conventional output buffers commonly electrically connected to a power voltage and a ground voltage. Each of the output buffers B1~Bn is coupled to both of a common power source Vpp and a common ground Vss. Since the common power source Vpp is electrically connected to a pad via pins and bounding wires, parasitic inductances associated with the pins and pad/bounding wires will be generated between the output buffers B1~Bn and the common power source Vpp, which is indicated by an equivalent inductance L1. Likewise, pin parasitic inductance and pad/bounding-wire inductance are generated between the output buffers B1~Bn and the common ground Vss, which is indicated by an equivalent inductance L2.

Due to the existence of the parasitic inductances L1 and L2 between the output buffers B1~Bn and the common power source and ground Vpp and Vss, respectively, when some of the output buffers B1~Bn change their output states at the same time, instaneous current change will result in the undesirable power/ground bounce effect.

Please refer to FIG. 2. When a number of output buffers simultaneously change their output states from a low level to a high level, the SSO skew phenomenon is likely to occur so as to delay the parallel data signal MD to some extent, as indicated by a period T1 of FIG. 2. Likewise, for the change of the output states of the output buffers from a high level to a low level, the parallel data signal MD is delayed as indicated by a period T2 of FIG. 2 due to the SSO skew phenomenon. The degree of the SSO skew is dependent on numbers of output buffers on changing. That is to say, when more output buffers change from the low level to the high level or the high level to the low level at the same time, the SSO skew becomes more serious, and the delayed period T1 or T2 is increased.

Along with the parallel data signal, a strobe signal DQS is outputted to decide when a downstream device should pick up the parallel data. Generally, the rising and falling edges of the strobe signal DQS are located within effective access ranges of the parallel data signal MD and preferably in the middle of the effective access ranges. Due to the SSO skew, the time margin allowing the downstream device to pick up the parallel data in response to the original strobe signal is even limited if a large quantity of parallel data required to be processed by the I/O bus. For example, parallel data of up to 64 bits are simultaneously processed by a Dynamic Random Access Memory (DRAM) or a central processing unit (CPU). The reduced time margin leads to the difficulty in receiving data or obtaining accurate data.

SUMMARY OF THE INVENTION

It is an object of the present invention to provide an output circuit for outputting a strobe signal and a parallel data signal so as to compensate influence of SSO skew and thus assure of accurate data transmission.

An output circuit according to an embodiment of the present invention includes a detector receiving a parallel data signal, detecting a level change degree for the parallel data signal between a first time point and a second time point, and outputting a select signal according to the level change degree; a delay adjusting device receiving and differentially delaying the parallel data signal into a first and a second delayed parallel data signals with a first and a second delay time, respectively; and a first multiplexer electrically connected to the detector and the delay adjusting device, and selecting one of the first and the second delayed parallel data signals to be outputted in response to the select signal.

A method for outputting a parallel data signal aligned with a strobe signal according to the present invention includes steps of: detecting a level change degree for the parallel data signal between a first time point and a second time point, and outputting a select signal according to the level change degree; delaying differentially the parallel data signal into a plurality of delayed parallel data signals with a plurality of delay time, respectively; and outputting one of the plurality of delayed parallel data signals in response to the select signal.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

Figure 1:
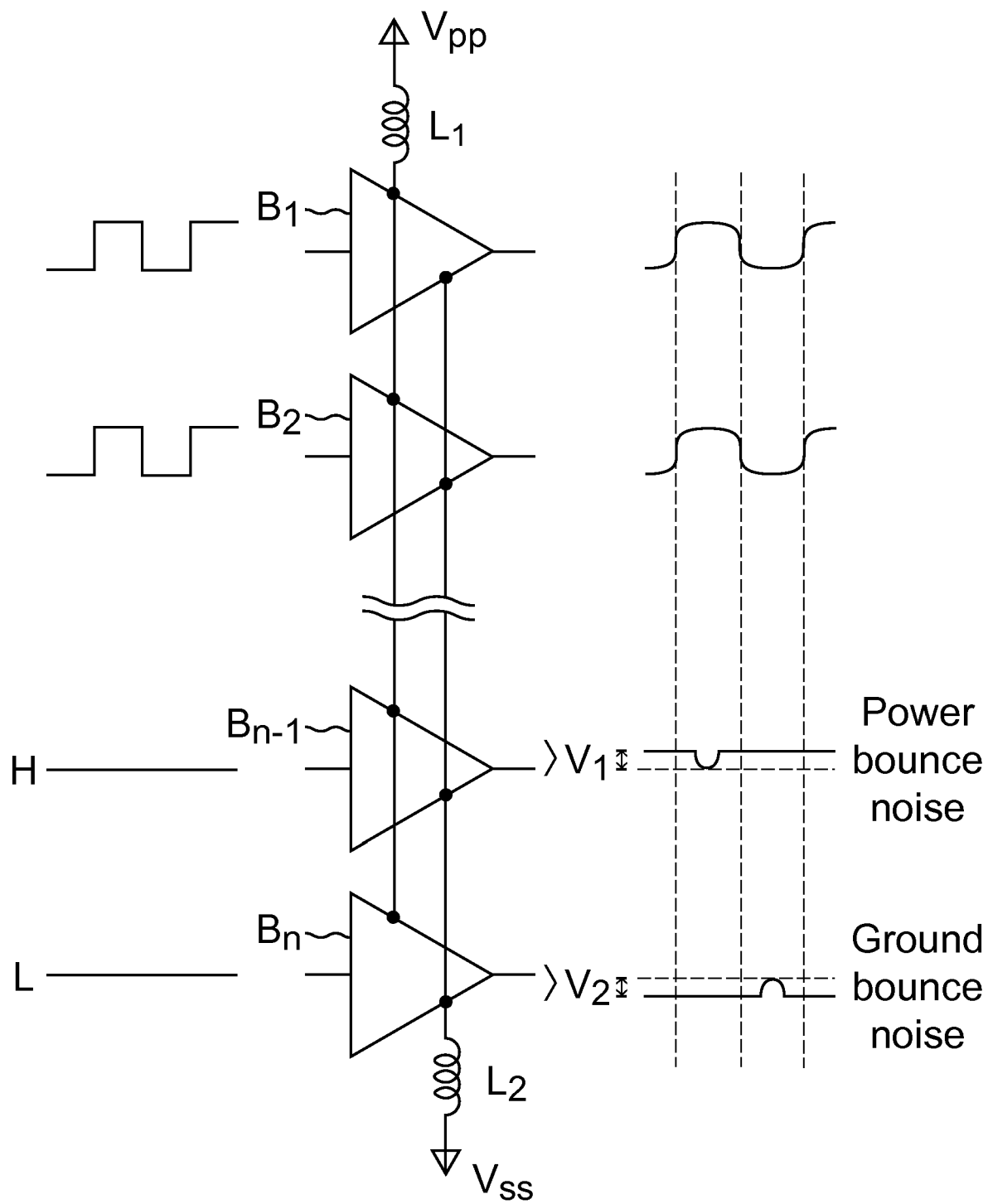
FIG. 1 schematically illustrates power/ground bounce occurring in output buffers commonly electrically connected to a power voltage and a ground voltage.
Figure 2:
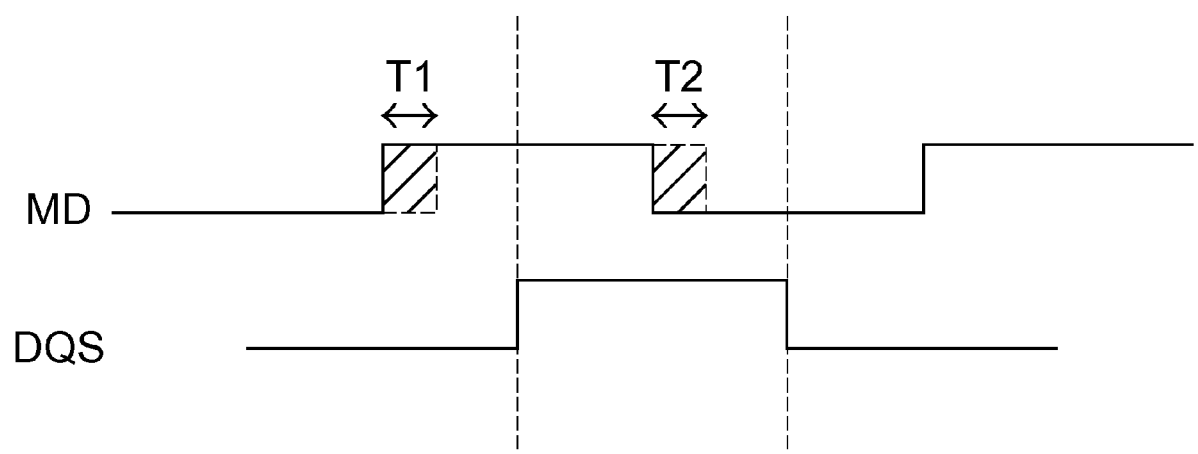
FIG. 2 is a timing waveform diagram showing misalignment of the output parallel data signal and the strobe signal due to SSO skew.
Figure 3A:
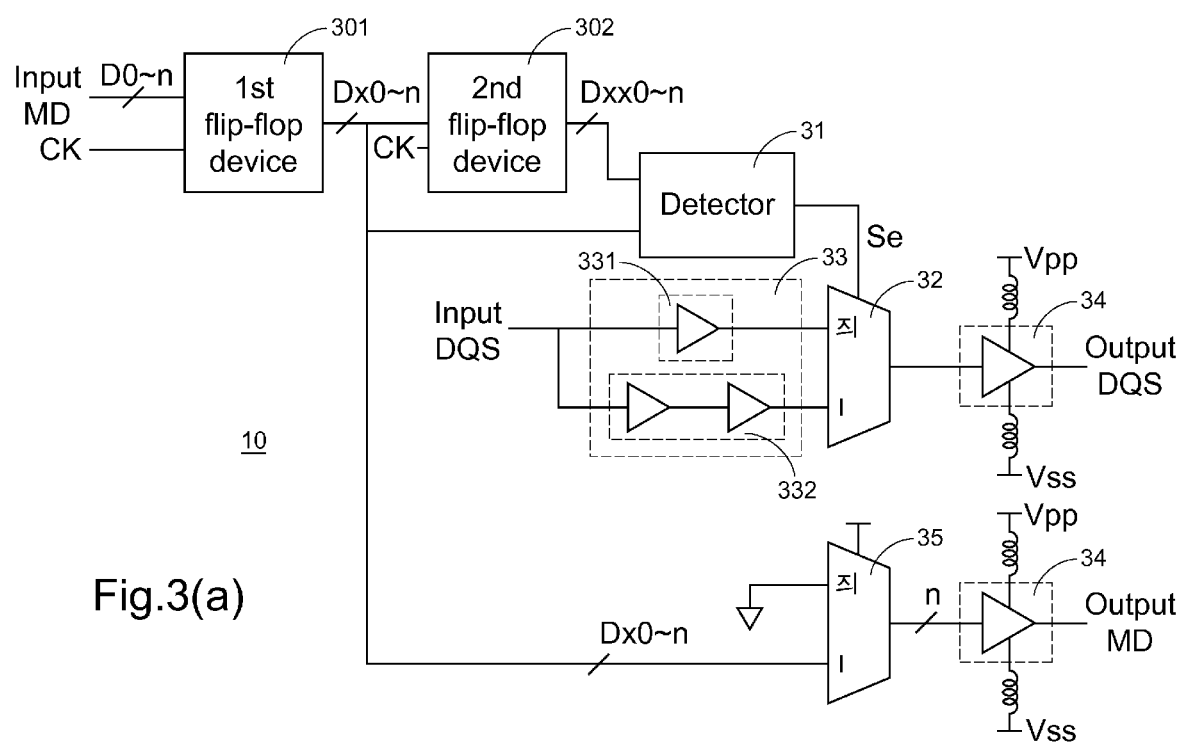
FIGS. 3(a), 3(b), 3(c) and 3(d) are schematic circuit block diagram illustrating four embodiments of output circuits for outputting aligned strobe and parallel data signals according to the present invention, respectively.

Please refer to FIG. 3(a), which illustrates an output circuit for outputting aligned strobe and parallel data signals according to a preferred embodiment of the present invention. The alignment of the strobe signal with the parallel data signal means the rising and/or falling edge of the output strobe signal is located within the valid data pickup range of the parallel data signal. More specifically, the phase difference between the output strobe signal and the output parallel data signal is kept at ¼ cycle, i.e. 90 degrees, by the present output circuit, and the setup/hold time margin of the output strobe signal for receiving data is identical to that of the input strobe signal.

The output circuit in this embodiment is implemented by adjusting the phase of the strobe signal and comprises a first flip-flop device 301, a second flip-flop device 302, a detector 31, a first multiplexer 32, a delay adjusting device 33, I/O pads 34 and a second multiplexer 35. The first flip-flop device 301 receives an input parallel data signal MD and a clock signal CK. In response to either rising or falling edges of the clock signal CK, the first flip-flop device 301 latches the input parallel data signal MD to output first latched parallel data. Then the second flip-flop device 302 receives and latches the first latched parallel data in response to the rising or falling edges of the clock signal CK, and outputs second latched parallel data. Therefore, at a certain time point when a rising or falling edge of the clock signal CK is entered, parallel data D0~n are received by the output circuit 10 and inputted to the first flip-flop device 301, first latched parallel data Dx0~n are outputted from the first flip-flop device 301 to the second flip-flop device 302, and second latched parallel data Dxx0~n are outputted by the second flip-flop device 302. The first latched parallel data Dx0~n are also outputted to the multiplexer 35.

The latched parallel data Dx0~n and Dxx0~n are transmitted to the detector 31, and the detector 31 outputs a select signal Se according to the difference between the first latched parallel data Dx0~n and the second latched parallel data Dxx0~n. More specifically, a level change degree of the two parallel data Dx0~n and Dxx0~n, which are realized by latching the parallel data signal MD at two different time points, is determined by the detector 31. When the level change degree is over 50%, i.e. over 50% levels of parallel data are changed, a heavy switching group is determined and thus a high-level select signal Se is asserted. On the contrary, a light switching group is determined so that the detector 31 asserts a low-level select signal Se when the level change degree is under 50%. Take an 8-bit input parallel data signal for example. The detector 31 outputs a high-level select signal when levels of 5~8 bits of data are changed, while the detector 31 outputs a low-level select signal when levels of 0~4 bits of data are changed. Since the degree of the undesired SSO skew of the output parallel data signal MD is dependent on numbers of output buffers on level-changing, the SSO will be more serious in the heavy switching group than in the light switching group. Therefore, phase drift Tssoh occurring in the heavy switching group is more significant than phase drift Tssol occurring in the light switching group, as shown in FIG. 4.

Figure 4:
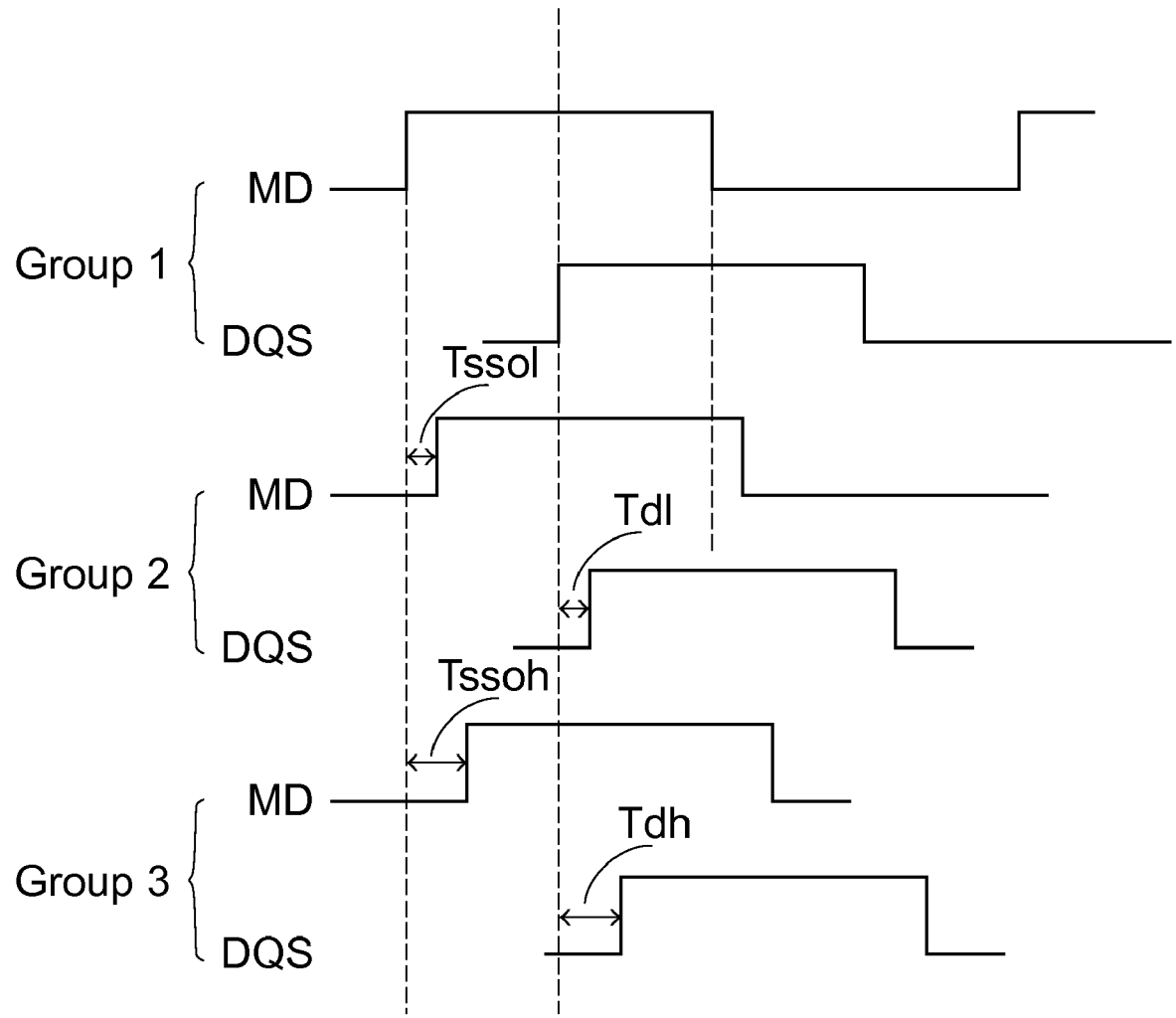
FIG. 4 is a timing waveform diagram illustrating the alignment of parallel data signals with corresponding strobe signals by adjusting the phase of the strobe signals.

In FIG. 4, the pair of output parallel data signal MD and the output strobe signal DQS in Group1 represent ideal situation without SSO screw. The pair of the output parallel data signal MD and the output strobe signal DQS in Group 2 represent light switching group situation with less significant SSO screw, while the pair of output parallel data signal MD and the output strobe signal DQS in Group 3 represent heavy switching group situation with more significant SSO screw. Accordingly, the strobe signal is outputted with delay time varying with the degree of the SSO skew for making compensation according to the present invention. For example, when the heavy switching group is determined, the strobe signal DQS is delayed by a relatively delay time Tdh to compensate the phase drift Tssoh. On the other hand, a relatively short delay time Tdl of the strobe signal is required to compensate the phase drift Tssol. As shown in FIG. 4, by the adjusting method of the present invention, the output condition of the strobe signal DQS can vary with the situation of the parallel data signal MD so as to be properly aligned with the output parallel data signal MD. In this embodiment, the delay adjusting device 33 is provided to achieve this purpose.

Referring to FIG. 3(a) again, the delay adjusting device 33 is coupled to the first multiplexer 32 and receives an input strobe signal DQS. The delay adjusting device 33 comprises a first delay circuit 331 and a second delay circuit 332, both electrically connected to the first multiplexer 32. While the first delay circuit 331 operates to provide the relatively short delay time Tdl, the second delay circuit 332 operates to provide the relatively long delay time Tdh. By means of the first and the second delay circuits, the input strobe signal DQS is differentially delayed so as to make different degrees of compensation for the output strobe signal DQS in order to align the output strobe signal DQS with the output parallel data signal MD. As mentioned above, the select signal Se is at a low level in the light switching group situation and a high level in the heavy switching group situation. Therefore, the output of the first delay circuit 331 is selected by the first multiplexer 32 to be outputted in response to a low level of the select signal Se. On the other hand, when the select signal Se is at a high level, the output of the second delay circuit 332 is selected by the first multiplexer 32 to be outputted. Preferably, the second multiplexer 35 similar to the first multiplexer 32 is arranged in the data signal path to perform a dummy delay operation on the parallel data signal MD in order to compensate the time delay of the first multiplexer 32.

Figure 3B:
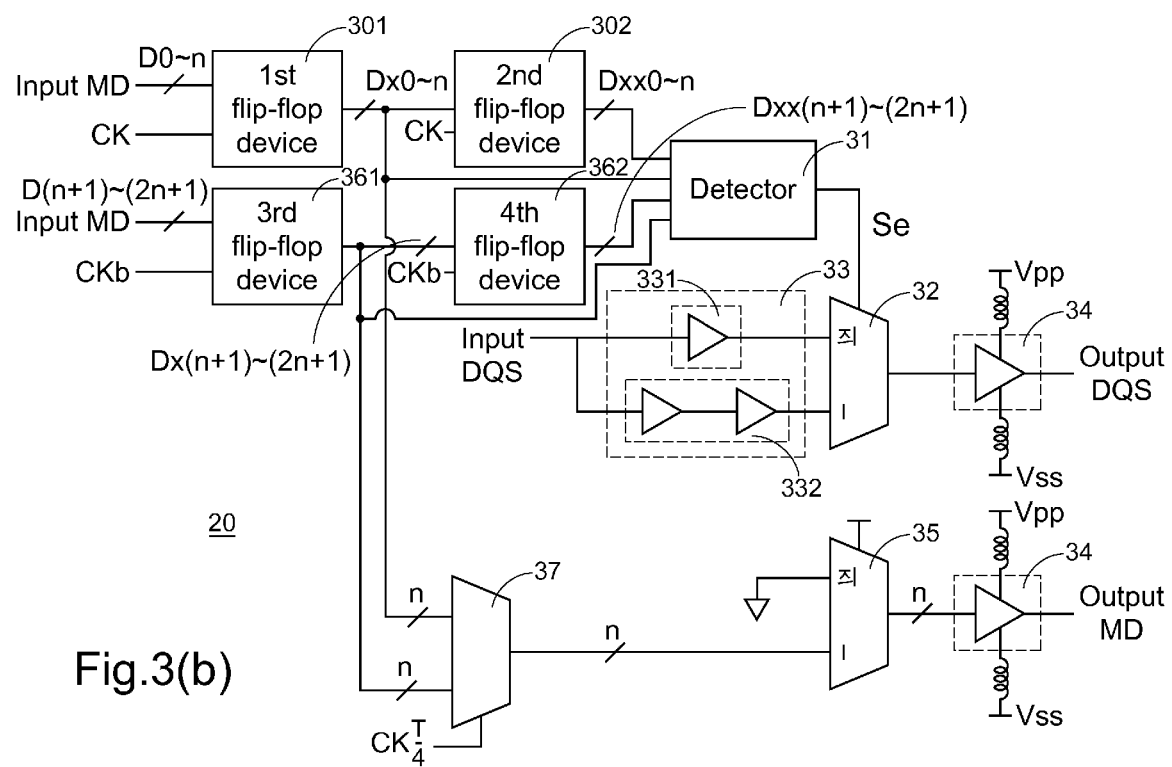

Please refer to FIG. 3(b), which schematically shows a second embodiment of the output circuit according to the present invention. The output circuit 20 of FIG. 3(b) is similar to the output circuit 10 of FIG. 3(a) except that a third flip-flop device 361, a fourth flip-flop device 362 and a third multiplexer 37 are further included in the output circuit 20 in order to perform Double Data Rate (DDR) transmission. The output circuit 20 in this embodiment also outputs aligned parallel data signal MD and strobe signal DQS by adjusting the phase of the strobe signal. The third flip-flop device 361 receives the input parallel data signal MD and a clock signal CKb. The clock signal CKb has a phase reverse to the clock signal CK. In response to either the rising or the falling edges of the clock signal CKb, the third flip-flop device 361 latches the input parallel data signal MD, and then outputs third latched parallel data Dx(n+1)~(2n+1). The fourth flip-flop device 362 receives and latches the third latched parallel data Dx(n+1)~(2n+1) in response to the rising or falling edge of the clock signal CKb, and then outputs fourth latched parallel data Dxx(n+1)~(2n+1). Therefore, at a certain time point when the rising or falling edge of the clock signal CK is entered, parallel data D0~n are inputted to the first flip-flop device 301, first latched parallel data Dx0~n are outputted by the first flip-flop device 301, and second latched parallel data Dxx0~n are outputted by the second flip-flop device 302. The first latched parallel data Dx0~n are also outputted to the multiplexer 37. Subsequently, at next time point when the rising or falling edge of the clock signal CKb is entered, parallel data D(n+1)~(2n+1) are inputted to the third flip-flop device 361, third latched parallel data Dx(n+1)~(2n+1) are outputted by the third flip-flop device 361, and fourth latched parallel data Dxx(n+1)~(2n+1) are outputted by the fourth flip-flop device 362. The third latched parallel data Dx(n+1)~(2n+1) are also outputted to the multiplexer 37. In this embodiment, the first latched parallel data Dx0~n outputted from the first flip-flop device 301 and the third latched parallel data Dx(n+1)~(2n+1) outputted from the third flip-flop device 361 are alternately outputted by the multiplexer 37 in response to both of the rising and falling edges of a clock signal CKT/4, thereby achieving the purpose of DDR transmission. The clock signal CKT/4 is derived from the clock signal CK with ¼ cycle (90°) delay.

The detector 31 detects the latched parallel data, and outputs a select signal Se according to a level change degree of the parallel data realized by latching the parallel data signal MD at different time points. For example, the detector 31 detects the latched parallel data Dx0~n and Dxx0~n in response to the rising edge of the clock signal CK at the time point TP1, and detects the latched parallel data Dx(n+1)~(2n+1) and Dxx(n+1)~(2n+1) in response to the rising edge of the clock signal CKb at the time point TP2 next to TP1. In response to any of the detection operations, the detector 31 outputs the select signal Se indicative of a light switching group to have the multiplxer 32 select the output of the first delay circuit 331 or the select signal Se indicative of a heavy switching group to have the multiplxer 32 select the output of the first delay circuit 332. As has been understood from the first embodiment, while the strobe signal DQS outputted from the delay circuit 332 is delayed by a relatively long delay time Tdh, the strobe signal DQS outputted from the delay circuit 331 is delayed by a relatively short delay time Tdl. The adjusting method illustrated with reference to the waveform diagram of FIG. 4 can also be applied here.

Figure 3C:
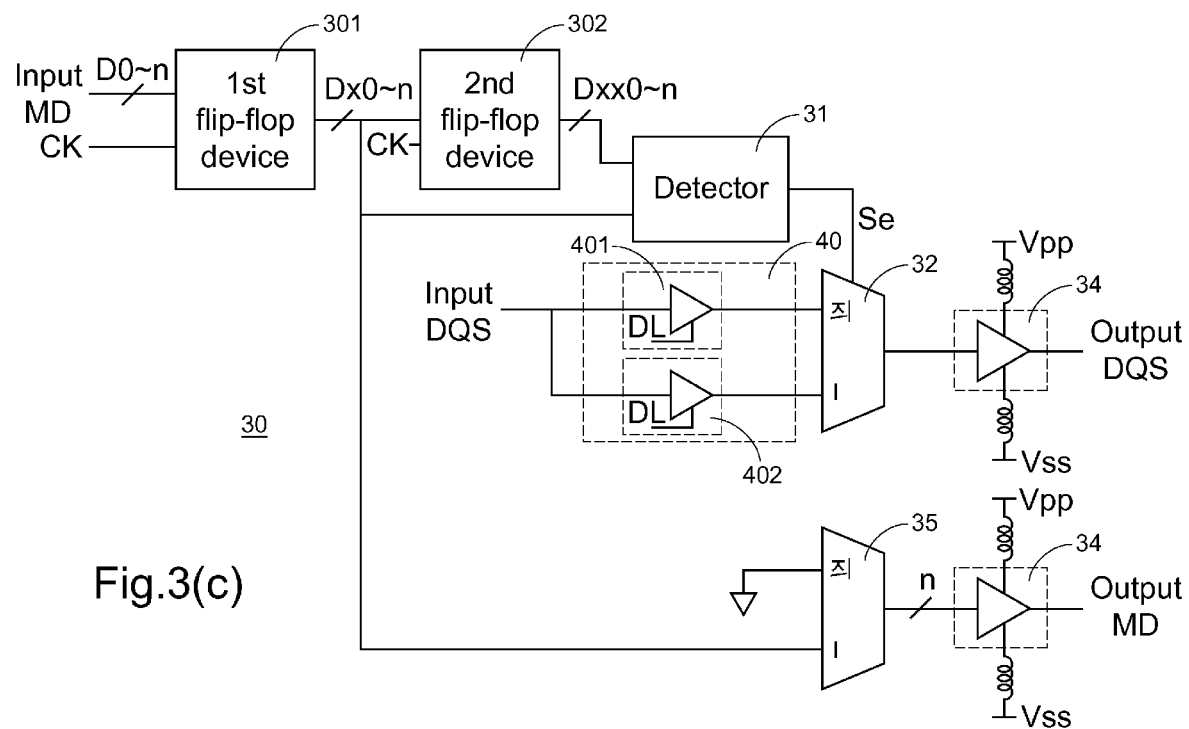

Please refer to FIG. 3(c), which schematically shows a third embodiment of the output circuit according to the present invention. The output circuit 30 of FIG. 3(c) is similar to that of FIG. 3(a) except for the replacement of a delay adjusting device 40 for the delay adjusting device 33. The delay adjusting device 40 comprises a first delay circuit 401 and a second delay circuit 402. Each of the first delay circuit 401 and the second delay circuit 402 is controlled by a load control signal DL associated with a driven load required for data transmission, respectively. For example, the output circuit 30 of FIG. 3(c) is used in a computer system, and the driven load relates to a memory device. When a great amount of memories are inserted into the slots of the computer, a considerable driven load is imposed on the computer system. On the contrary, for a small amount of memories, the driven load is relatively low. In this embodiment, both of the first delay circuit 401 and second delay circuit 402 delay the strobe signal DQS by a relatively long delay time for a high driven load situation, and delay the strobe signal DQS by a relatively short delay time for a low driven load situation. In practice, when the computer system is initiated, a basic input/output system (BIOS) will detect the associated driven load and transmit information of the driven load to a control chip (not shown). The control chip then transmits the load control signal DL to the delay adjusting device 40 so as to properly adjust delay time of the strobe signal DQS. For example, when the BIOS detects only one memory is inserted into the slot, a delay time Tdl (for example 0.1 ns) of the strobe signal DQS is rendered to compensate for the light switching group situation, and a delay time Tdh (for example 0.3 ns) is rendered to compensate for the heavy switching group situation. In another example where four memories are inserted into the slots, a delay time Tdl' (for example 0.3 ns) of the strobe signal DQS is rendered to compensate for the light switching group situation, and a delay time Tdh' (for example 0.5 ns) is rendered to compensate for the heavy switching group situation. In other words, the delay time of the strobe signal DQS outputted by the multiplexer 32 from either of the first delay circuit 401 and the second delay circuit 402 can be automatically adjusted according to the load control signal DL indicative of certain driven load of the computer system.

Figure 3D:
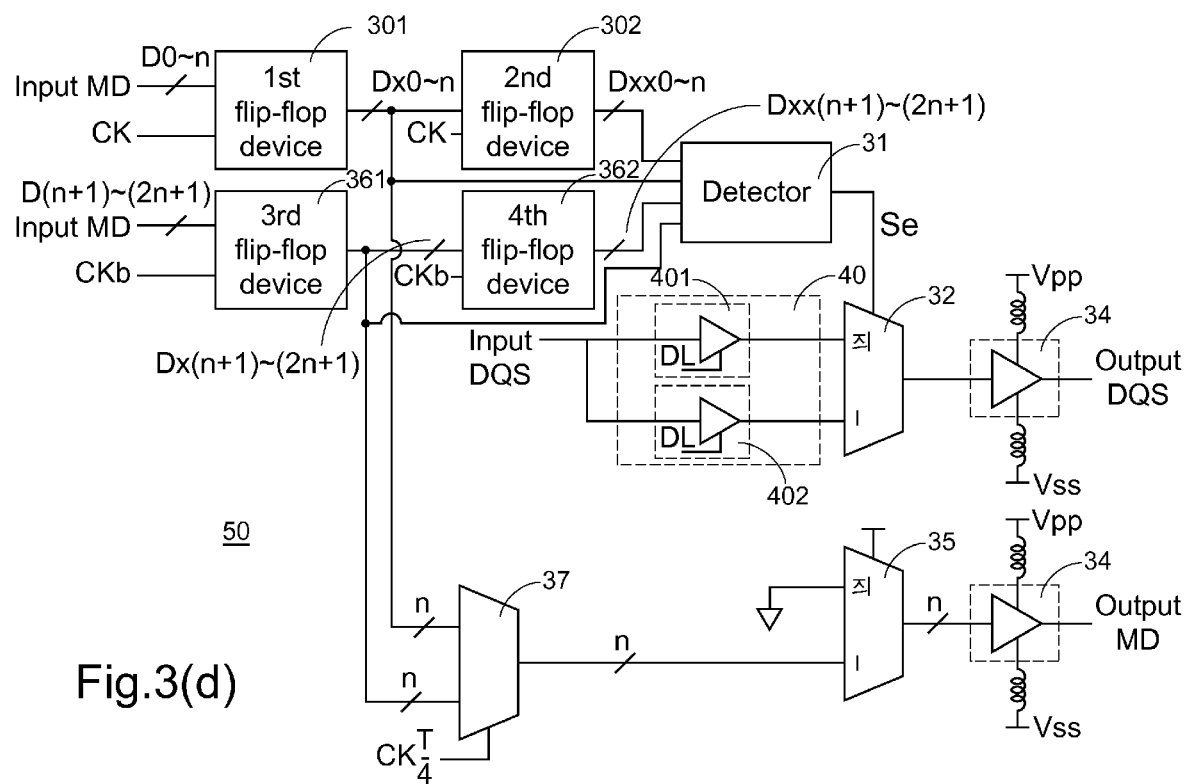

Please refer to FIG. 3(d), which schematically shows a fourth embodiment of the output circuit according to the present invention. The output circuit 50 of FIG. 3(d) is similar to that of FIG. 3(c) except that a third flip-flop device 361, a fourth flip-flop device 362 and a third multiplexer 37 are further included in the output circuit 50, thereby providing a Double Data Rate (DDR) transmission. Please refer to FIG. 3(b) and the relevant description to understand the functions and operations of the third flip-flop device 361, fourth flip-flop device 362 and third multiplexer 37.

Figure 5A:
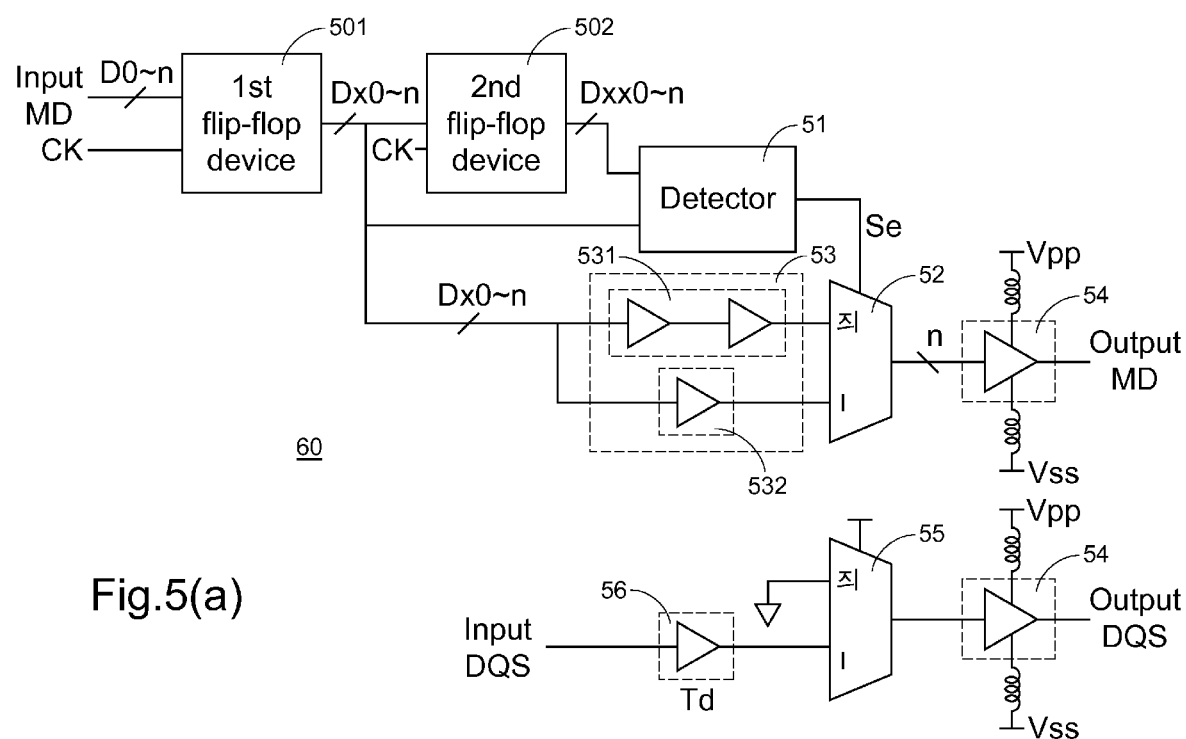
FIGS. 5(a) and 5(b) are circuit block diagram illustrating two embodiments of output circuits for outputting aligned strobe and parallel data signals according to the present invention, respectively.

Please refer to FIG. 5(a), which illustrates an output circuit 60 for outputting aligned strobe and parallel data signals according to fifth embodiment of the present invention. The output circuit 60 is implemented by adjusting the phase of the parallel data signals and comprises a first flip-flop device 501, a second flip-flop device 502, a detector 51, a first multiplexer 52, a delay adjusting device 53, I/O pads 54 and a second multiplexer 55.

The first flip-flop device 501 receives an input parallel data signal MD and a clock signal CK. In response to either of the rising and falling edge of the clock signal CK, the first flip-flop device 501 latches the parallel data D0~n, and subsequently outputs first latched parallel data Dx0~n. The second flip-flop device 502 receives the first latched parallel data Dx0~n and the clock signal CK. In response to the rising or falling edge of the clock signal CK, the second flip-flop device 502 latches the first latched parallel data Dx0~n and outputs second latched parallel data Dxx0~n. Therefore, at a certain time point when the rising or falling edge of the clock signal CK is entered, parallel data D0~n are inputted to the first flip-flop device 501, first latched parallel data Dx0~n are outputted by the first flip-flop device 501, and second latched parallel data Dxx0~n are outputted by the second flip-flop device 502. The parallel data Dx0~n are also outputted via the delay adjusting device 53, the multiplexer 52 and the I/O pad 54.

Figure 6:
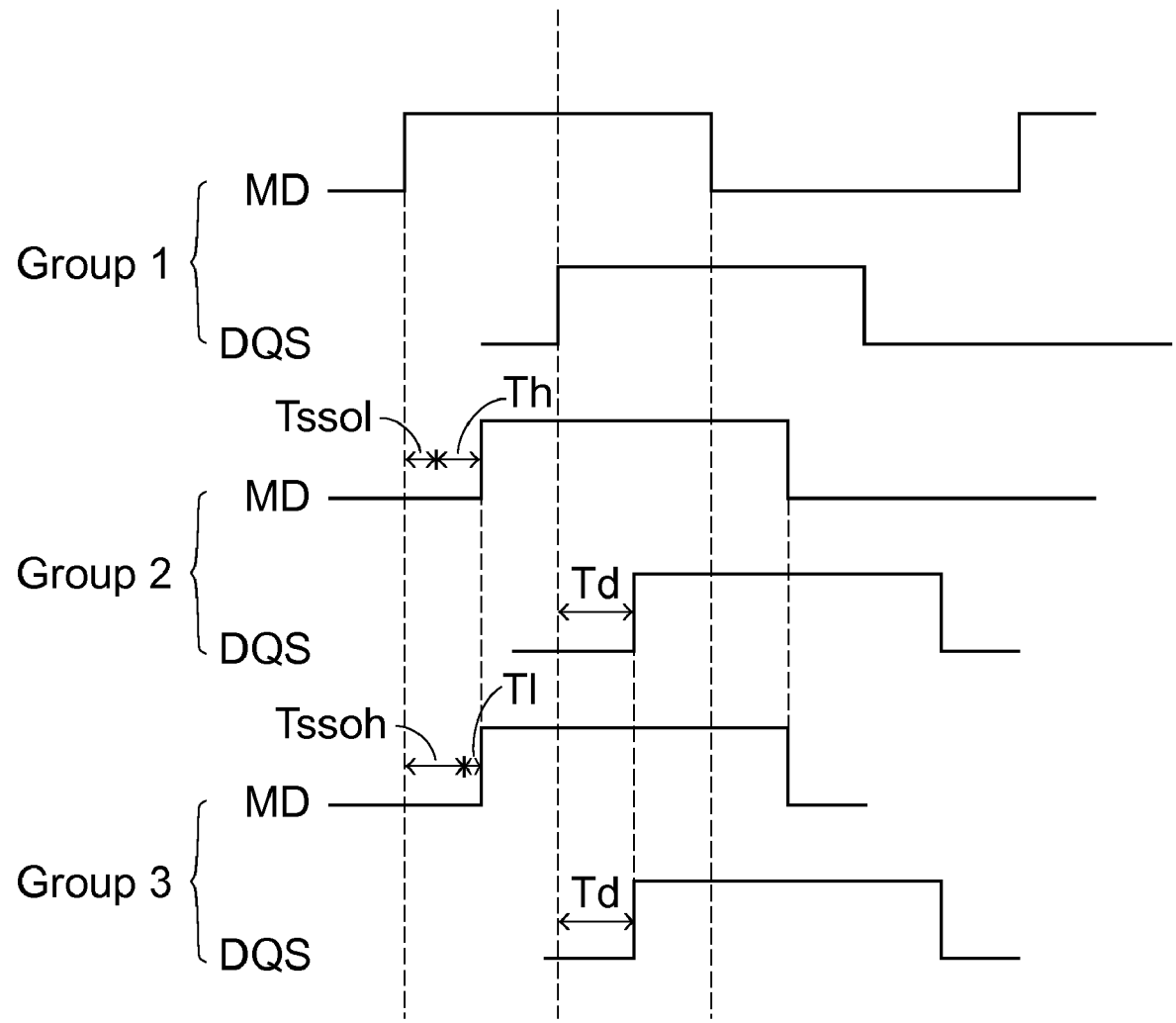
FIG. 6 is a timing waveform diagram illustrating the alignment of parallel data signals with strobe signals by adjusting the phase of the parallel data signals.

The detector 51 is employed to detect the latched parallel data Dx0~n and Dxx0~n, which represent the parallel data obtained by latching the parallel data signal MD at different time points, and outputs a select signal Se according to a level change degree of the two sets of parallel data. When the level change degree is over 50%, i.e. over 50% levels of parallel data are changed, a heavy switching group is determined and thus a high-level select signal Se is asserted. On the contrary, a light switching group is determined so that the detector 51 asserts a low-level select signal Se when the level change degree is under 50%. In FIG. 6, the pair of output parallel data signal MD and the output strobe signal DQS in Group 1 represent ideal situation without SSO screw. The pair of the output parallel data signal MD and the output strobe signal DQS in Group 2 represent light switching group situation with less significant SSO screw, while the pair of output parallel data signal MD and the output strobe signal DQS in Group 3 represent heavy switching group situation with more significant SSO screw. Accordingly, the strobe signal is outputted with a constant and longest delay time Td, and the parallel data signal is outputted with a delay time varying with the degree of the SSO skew for compensation according to the present invention. For example, when the heavy switching group is determined, the strobe signal DQS is delayed by a time Td, and the parallel data signal is delayed by a relatively short delay time T1 to compensate the phase drift Tssoh, where Td=Tssoh+T1. On the other hand, when the light switching group is determined, the strobe signal DQS is delayed by a time Td, and the parallel data signal is delayed by a relatively long delay time Th to compensate the phase drift Tssol, where Td=Tssol+Th. In this embodiment, the delay adjusting device 53 is provided to achieve this purpose.

Referring to FIG. 5(a) again, the delay adjusting device 53 is coupled to the first flip-flop device 501 and receives the first latched parallel data Dx0~n. The delay adjusting device 53 comprises a first delay circuit 531 and a second delay circuit 532, both electrically connected to the first multiplexer 52. While the first delay circuit 531 operates to provide the relatively long delay time Th, the second delay circuit 532 operates to provide the relatively short delay time T1. By means of the first and the second delay circuits 531 and 532, the first latched parallel data Dx0~n is differentially delayed so as to make different degrees of compensation in order to align with the output strobe signal DQS having been delayed by the longest delay time Td by the delay circuit 56. As mentioned above, the select signal Se is at a low level in the light switching group situation and a high level in the heavy switching group situation. Therefore, the output of the first delay circuit 531 is selected by the first multiplexer 52 to be outputted in response to a low level of the select signal Se. On the other hand, when the select signal Se is at a high level, the output of the second delay circuit 532 is selected by the first multiplexer 52 to be outputted. Preferably, the second multiplexer 55 similar to the first multiplexer 52 is arranged in the data signal path to perform a dummy delay operation on the strobe signal DQS in order to compensate the time delay of the first multiplexer 52.

Figure 5B:
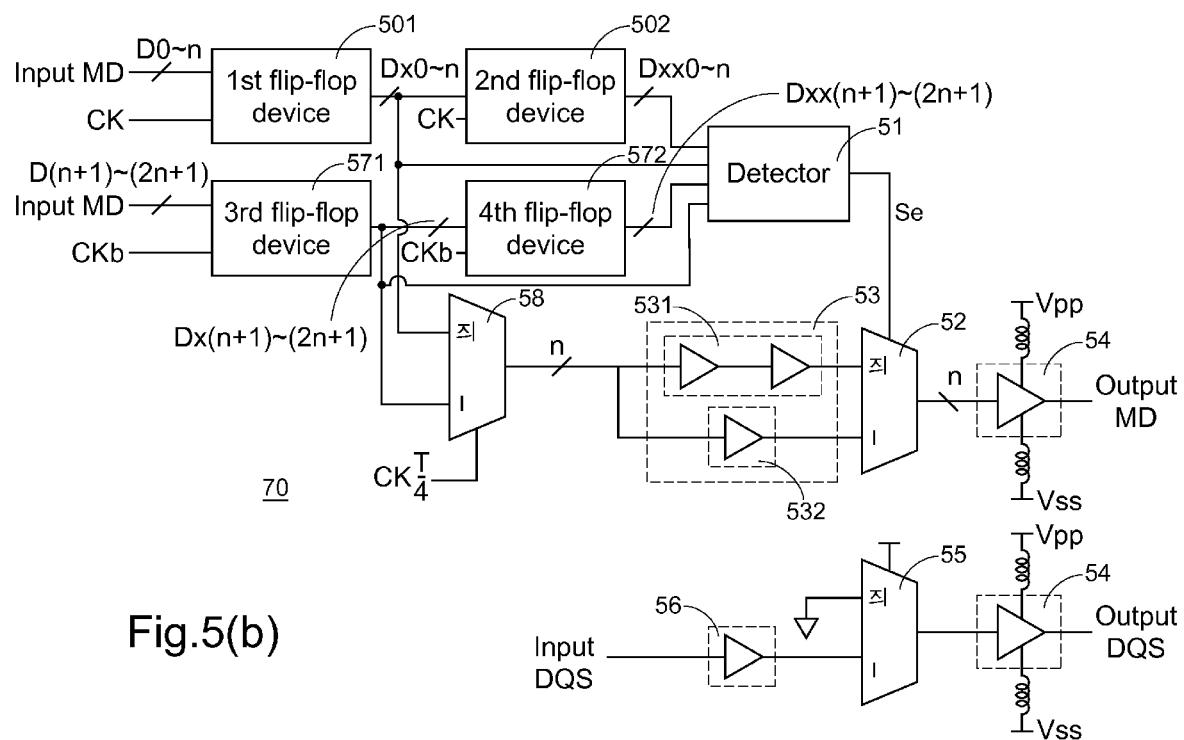

Please refer to FIG. 5(b), which schematically shows a sixth embodiment of the output circuit according to the present invention. The output circuit 70 of FIG. 5(b) is similar to that of FIG. 5(a) except that a third flip-flop device 571, a fourth flip-flop device 572 and a third multiplexer 58 are further included in the output circuit 70 in order to perform Double Data Rate (DDR) transmission. The output circuit 70 in this embodiment also outputs aligned parallel data signal and strobe signal by differentially adjusting the phase of the parallel data signal. The third flip-flop device 571 receives the input parallel data signal MD and a clock signal CKb. The clock signal CKb has a phase reverse to the clock signal CK. In response to either the rising or the falling edges of the clock signal CKb, the third flip-flop device 571 latches the input parallel data signal MD and then outputs third latched parallel data. The fourth flip-flop device 572 receives and latches the third latched parallel data in response to the rising or falling edge of the clock signal CKb, and then outputs fourth latched parallel data. Therefore, at a certain time point when the rising or falling edge of the clock signal CK is entered, parallel data D0~n are inputted to the first flip-flop device 501, first latched parallel data Dx0~n are outputted by the first flip-flop device 501, and second latched parallel data Dxx0~n are outputted by the second flip-flop device 502. The first latched parallel data Dx0~n are further outputted to the multiplexer 58. Subsequently, at next time point when the rising or falling edge of the clock signal CKb is entered, parallel data D(n+1)~(2n+1) are inputted to the third flip-flop device 571, third latched parallel data Dx(n+1)~(2n+1) are outputted by the third flip-flop device 571, and fourth latched parallel data Dxx(n+1)~(2n+1) are outputted by the fourth flip-flop device 572. The third latched parallel data Dx(n+1)~(2n+1) are also outputted to the multiplexer 58. In this embodiment, the first latched parallel data Dx0~n outputted from the first flip-flop device 501 and the third latched parallel data Dx(n+1)~(2n+1) outputted from the third flip-flop device 571 are alternately outputted by the multiplexer 58 in response to both of the rising and falling edges of a clock signal CKT/4, thereby achieving the purpose of DDR transmission. The clock signal CKT/4 is derived from the clock signal CK with ¼ cycle (90°) delay.

The detector 51 detects the latched parallel data, and outputs a select signal Se according to a level change degree of the parallel data realized by latching the parallel data signal MD at different time points. For example, the detector 51 detects the latched parallel data Dx0~n and Dxx0~n in response to the rising edge of the clock signal CK at the time point TP1, and detects the latched parallel data Dx(n+1)~(2n+1) and Dxx(n+1)~(2n+1) in response to the rising edge of the clock signal CKb at the time point TP2 next to TP1. In response to any of the detection operations, the detector 51 outputs the select signal Se indicative of a light switching group to have the multiplxer 52 select the output of the first delay circuit 531 or the select signal Se indicative of a heavy switching group to have the multiplxer 52 select the output of the first delay circuit 532. As has been understood from the first embodiment, while the parallel data signal MD outputted from the delay circuit 532 is delayed by a relatively short delay time T1, the parallel data signal MD outputted from the delay circuit 531 is delayed by a relatively long delay time Th. The adjusting method illustrated with reference to the waveform diagram of FIG. 6 can also be applied here.

According to the output circuits and aligning methods illustrated above, it is understood that the parallel data signal and the strobe signal can be outputted with proper alignment by differentially adjusting the phase of the parallel data signal or strobe signal. Suitable delay circuits designed according to the present invention are provided to achieve this purpose. Due to the alignment of the parallel data signal and strobe signal, the SSO skew can be compensated so as to improve the data transmission quality.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An output circuit for outputting a parallel data signal aligned with a strobe signal, comprising:
   a first flip-flop device receiving the parallel data signal and a first clock signal, and outputting a first latched parallel data in response to the first clock signal; and
   a second flip-flop device electrically connected to the first flip-flop device, receiving the first latched parallel data outputted from the first flip-flop device and the first clock signal, and outputting a second latched parallel data in response to the first clock signal;
   a detector electrically connected to the first flip-flop device and the second flip-flop device, detecting a level change degree of the first latched parallel data and the second latched parallel data, and outputting a select signal according to the level change degree;

a delay adjusting device receiving and differentially delaying the parallel data signal into a first and a second delayed parallel data signals with a first and a second delay time, respectively; and a first multiplexer electrically connected to the detector and the delay adjusting device, and selecting one of the first and the second delayed parallel data signals to be outputted in response to the select signal.

2. The output circuit according to claim 1 wherein the delay adjusting device comprises:

a first delay circuit electrically connected to the first multiplexer for delaying the parallel data signal into the first delayed parallel data signal and outputting the first delayed parallel data signal with the first delay time; and a second delay circuit electrically connected to the first multiplexer for delaying the parallel data signal into the second delayed parallel data signal and outputting the first delayed parallel data signal with the second delay time.

3. The output circuit according to claim 1 wherein the first flip-flop device and the second flip-flop device respectively latch the parallel data signal and the first latched parallel data at either the rising edge or the falling edge of the first clock signal.

4. The output circuit according to claim 1 further comprising:

a third delay circuit for delaying the strobe signal into a delayed strobe signal with a third delay time; and a second multiplexer electrically connected to the third delay circuit, and performing a dummy delay operation on the delayed strobe signal so as to compensate time delay of the first multiplexer.

5. The output circuit according to claim 4 wherein the third delay time is greater than each of the first delay time and the second delay time.

6. The output circuit according to claim 1 further comprising:

a third flip-flop device electrically connected to the detector, receiving the parallel data signal and a second clock signal, and outputting a third latched parallel data in response to the second clock signal; and a fourth flip-flop device electrically connected to the detector and the third flip-flop device, receiving the third latched parallel data outputted from the third flip-flop device and the second clock signal, and outputting a fourth latched parallel data in response to the second clock signal, wherein the third and the fourth latched parallel data are transmitted to the detector to determine another level change degree of the third latched parallel data and the fourth latched parallel data, and the detector outputs the select signal according to the another level change degree.

7. The output circuit according to claim 6 wherein a third multiplexer is electrically connected to the delay adjusting device, and selecting one of the first latched parallel data transmitted from the first flip-flop device and the third latched parallel data transmitted from the third flip-flop device to be outputted into the delay adjusting device in response to a third clock signal.

8. The output circuit according to claim 7 wherein the third clock signal has a phase difference of 45 degrees with respect to the first clock signal.

9. The output circuit according to claim 6 wherein the second clock signal is phase reversed to the first clock signal.

10. The output circuit according to claim 6 wherein the first flip-flop device and the second flip-flop device respectively latch the parallel data signal and the first latched parallel data at the rising edge of the first clock signal; wherein the third flip-flop device and the fourth flip-flop device respectively latch the parallel data signal and the third latched parallel data at the falling edge of the second clock signal.

11. The output circuit according to claim 6 wherein the first flip-flop device and the second flip-flop device respectively latch the parallel data signal and the first latched parallel data at the falling edge of the first clock signal; wherein the third flip-flop device and the fourth flip-flop device respectively latch the parallel data signal and the third latched parallel data at the rising edge of the second clock signal.

* * * * *

UNITED STATES PATENT AND TRADEMARK OFFICE
CERTIFICATE OF CORRECTION

PATENT NO.       : 7,634,677 B2                                   Page 1 of 1
APPLICATION NO.  : 11/559732
DATED            : December 15, 2009
INVENTOR(S)      : Chi Chang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 483 days.

Signed and Sealed this

Ninth Day of November, 2010

David J. Kappos
*Director of the United States Patent and Trademark Office*